(12) United States Patent
Ellis et al.

(10) Patent No.: US 8,842,480 B2
(45) Date of Patent: Sep. 23, 2014

(54) AUTOMATED CONTROL OF OPENING AND CLOSING OF SYNCHRONOUS DYNAMIC RANDOM ACCESS MEMORY ROWS

(75) Inventors: Jackson L. Ellis, Fort Collins, CO (US); Shruti Sinha, Maharashtra (IN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 141 days.

(21) Appl. No.: 13/569,276

(22) Filed: Aug. 8, 2012

(65) Prior Publication Data

US 2014/0043918 A1    Feb. 13, 2014

(51) Int. Cl.
*G11C 16/04* (2006.01)
*G11C 7/10* (2006.01)

(52) U.S. Cl.
CPC .................................. *G11C 7/1006* (2013.01)
USPC . 365/189.02; 365/201; 365/203; 365/230.02; 365/233.5; 714/738

(58) Field of Classification Search
CPC ... G11C 7/1078; G11C 7/1051; G11C 7/1006
USPC ............... 365/189.02, 201, 203, 230.02, 233; 714/738; 324/765
See application file for complete search history.

(56) References Cited

U.S. PATENT DOCUMENTS

| | | | |
|---|---|---|---|
| 6,486,493 B2 | 11/2002 | Arimoto et al. | 257/48 |
| 6,823,485 B1 | 11/2004 | Muranaka | 714/719 |
| 7,265,570 B2 | 9/2007 | Ong | 324/765 |
| 7,307,442 B2 | 12/2007 | Ong | 324/765 |
| 7,310,000 B2 | 12/2007 | Ong | 324/765 |
| 7,319,349 B2 | 1/2008 | Tomita | 327/144 |
| 7,365,557 B1 | 4/2008 | Ong | 324/765 |
| 7,366,965 B2 * | 4/2008 | Yamasaki et al. | 714/718 |
| 7,370,256 B2 | 5/2008 | Ong | 714/731 |
| 7,444,575 B2 | 10/2008 | Ong | 714/742 |
| 7,446,551 B1 | 11/2008 | Ong | 324/765 |
| 7,493,531 B2 | 2/2009 | Ito et al. | 714/708 |
| 7,577,884 B2 | 8/2009 | Ogura et al. | 714/718 |
| 7,721,175 B2 | 5/2010 | Resnick | 714/733 |
| 7,954,029 B2 | 5/2011 | Resnick | 714/733 |
| 8,001,439 B2 | 8/2011 | Ong | 714/742 |
| 8,166,361 B2 | 4/2012 | Ong | 714/738 |
| 2002/0047137 A1 | 4/2002 | Arimoto et al. | 257/213 |
| 2003/0212925 A1 | 11/2003 | Ogura et al. | 714/42 |
| 2005/0281112 A1 | 12/2005 | Ito et al. | 365/222 |
| 2005/0289428 A1 | 12/2005 | Ong | 714/742 |
| 2006/0066374 A1 | 3/2006 | Tomita | 327/291 |
| 2006/0150046 A1 | 7/2006 | Ong | 714/738 |
| 2006/0236180 A1 | 10/2006 | Ong | 714/731 |
| 2006/0253266 A1 | 11/2006 | Ong | 702/59 |

(Continued)

OTHER PUBLICATIONS

"JEDEC Standard, DDR2 SDRAM Specification, JESD79-2F (Revision of JESD79-2E)", Jedec Solid State Technology Association, Nov. 2009, 128 pages.

*Primary Examiner* — Connie Yoha (74) *Attorney, Agent, or Firm* — Christopher P. Maiorana, PC (57) ABSTRACT

An apparatus including a protocol engine and a built-in self test (BIST) engine. The built-in self test (BIST) engine is coupled to the protocol engine. The built-in self test (BIST) engine may be configured to directly control when to open and close rows of a synchronous dynamic random access memory (SDRAM) during double data rate (DDR) operations.

21 Claims, 6 Drawing Sheets

(56) References Cited

U.S. PATENT DOCUMENTS

| | | | |
|---|---|---|---|
| 2007/0067687 A1 | 3/2007 | Ong | 714/731 |
| 2007/0079204 A1 | 4/2007 | Ong | 714/738 |
| 2007/0159201 A1* | 7/2007 | Chen et al. | 324/765 |
| 2007/0168808 A1 | 7/2007 | Ong | 714/731 |
| 2008/0215946 A1* | 9/2008 | Ichikawa | 714/744 |
| 2009/0055698 A1 | 2/2009 | Resnick | 714/733 |
| 2009/0063913 A1* | 3/2009 | Yamasaki et al. | 714/718 |
| 2009/0193301 A1 | 7/2009 | Ito et al. | 714/704 |
| 2010/0223512 A1 | 9/2010 | Resnick | 714/718 |
| 2011/0251819 A1 | 10/2011 | Ong | 702/120 |

* cited by examiner

AUTOMATED CONTROL OF OPENING AND CLOSING OF SYNCHRONOUS DYNAMIC RANDOM ACCESS MEMORY ROWS

FIELD OF THE INVENTION

The present invention relates to memory generally and, more particularly, to a method and/or apparatus for implementing automated control of opening and closing of synchronous dynamic random access memory (SDRAM) rows.

BACKGROUND OF THE INVENTION

In a normal synchronous dynamic random access memory (SDRAM) operation, before any READ or WRITE command can be issued to a bank within the SDRAM, a row in that bank must be opened (activated). Opening a row in the bank is accomplished via an ACTIVE command, which selects both the bank and the row to be activated. A subsequent ACTIVE command to a different row in the same or a different bank can only be issued after the previous active row has been closed (precharged). Closing of the active row is accomplished via a PRECHARGE command. Testing of a synchronous dynamic random access memory (SDRAM) can be accomplished through a variety of methods, such as by a tester machine that can directly connect to the SDRAM. Another method that can be used to test an SDRAM already connected to the final system printed circuit board (PCB) is a built in self test (BIST) circuit.

To enable a BIST circuit to perform a wide variety of test patterns on synchronous dynamic random access memory (SDRAM), it would be desirable to implement automated control of the opening and closing of SDRAM rows.

SUMMARY OF THE INVENTION

The present invention concerns an apparatus including a protocol engine and a built-in self test (BIST) engine. The built-in self test (BIST) engine is coupled to the protocol engine. The built-in self test (BIST) engine may be configured to directly control when to open and close rows of a synchronous dynamic random access memory (SDRAM) during double data rate (DDR) operations.

The objects, features and advantages of the present invention include providing a method and/or apparatus for implementing automated control of opening and closing of synchronous dynamic random access memory (SDRAM) rows that may (i) allow a built in self test (BIST) engine to have complete control of when to open or close SDRAM rows during double data rate (DDR) operation, (ii) allow each READ or WRITE command to have a respective ACTIVE and PRECHARGE command, (iii) allow sending an ACTIVE command only when a new row is addressed, (iv) allow sending PRECHARGE command only when there is an ACTIVE row and a new row in the same bank is to be addressed, (v) provide a BIST engine that sends ACTIVE and PRECHARGE requests to a Protocol Engine, (vi) align ACTIVE and PRECHARGE requests with SDRAM address, (vii) be implemented in a DDR BIST controller, (viii) allow the BIST engine to minimize how long a test pattern takes, and/or (ix) allow the BIST engine to increase the level of testing related to opening and closing of rows.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

A double data rate (DDR) built in self test (BIST) controller in accordance with embodiments of the present invention generally implements test features that stress a dynamic random access memory (DRAM) to determine whether there is any defect. For the implementation of the test features, the DDR BIST controller (DBC) generally implements extra control of the DRAM protocol that normally is automated by a protocol engine. In general, a BIST engine sub-module in accordance with embodiments of the present invention is generally separate from (external to) a protocol engine sub-module. The BIST engine sub-module is generally responsible for implementing the extra control of the DRAM protocol. The extra control is used to implement features in accordance with embodiments of the present invention during All R/W patterns.

In contrast to conventional DRAM controllers that would automate when ACTIVE and PRECHARGE occur in a DRAM, in an embodiment in accordance with the present invention, a BIST engine controls whether ACTIVE and PRECHARGE commands occur at a granularity of whichever is larger between a 64-bit access or a double data rate (DDR) burst length. In one example, a protocol engine may be configured to support burst lengths of 4 or 8. With a 16-bit DDR interface (I/F), the burst lengths of 4 and 8 generally represent 8 and 16 bytes, respectively. Once the BIST engine has low level control of the DRAM bursts, the BIST engine may perform a wide variety of test patterns (e.g., static, increment, checkerboard, odd mode switching, inverted, XOR address, march, etc.). In one example, the BIST engine may be configured to perform the test patterns with a minimum time to complete. In another example, the BIST engine may be configured to perform frequent row opens and closes to better test the SDRAM.

Figure 1:
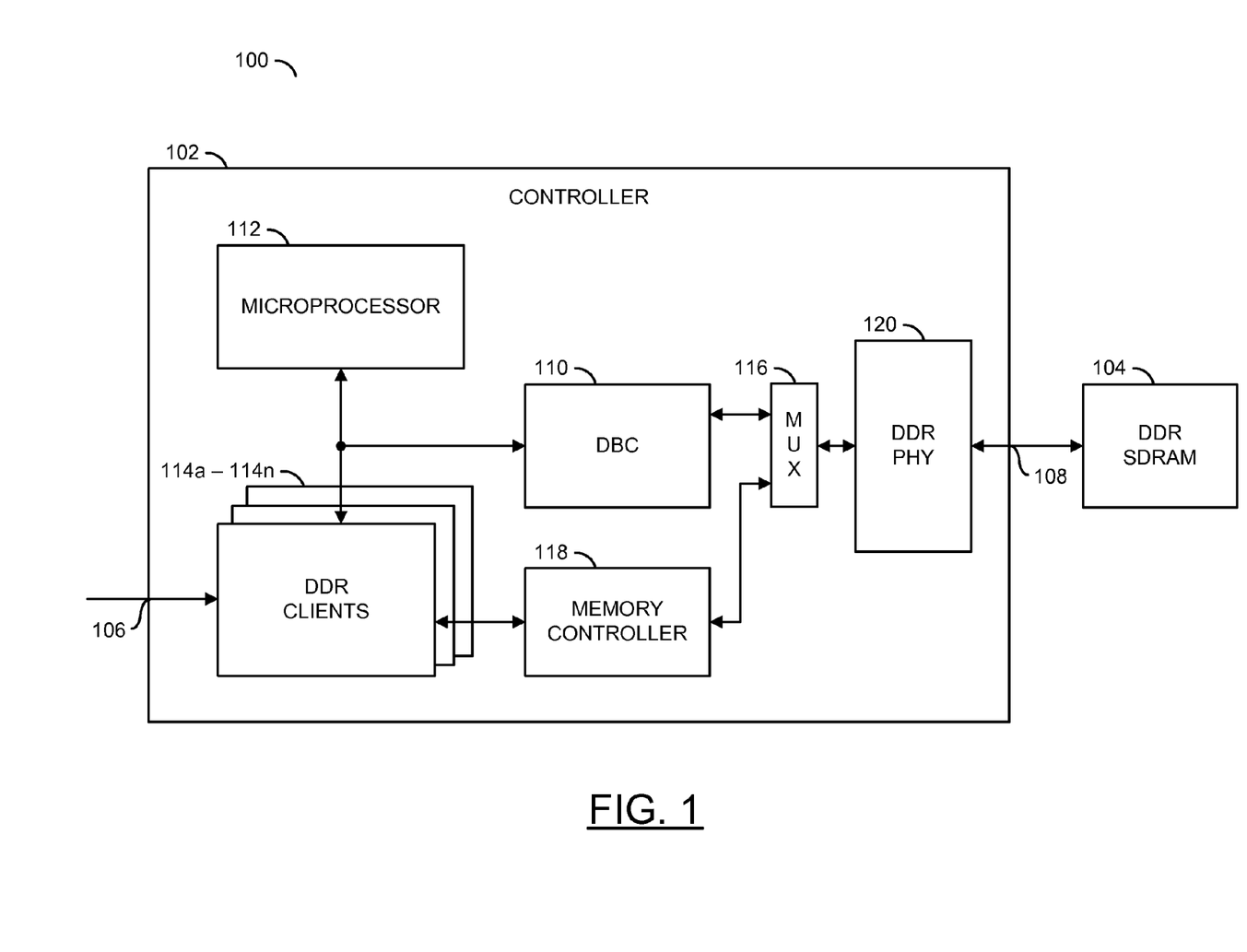
FIG. 1 is a block diagram illustrating a controller in accordance with an embodiment of the present invention.

Referring to FIG. 1, a block diagram of a system 100 is shown illustrating a controller in accordance with an embodiment of the present invention. The system 100 may comprise a block 102 and a block 104. The block 102 may be implemented, in one example, as a controller chip (e.g., an integrated circuit, a system on a chip (SoC), etc.). The block 104 may be implemented, in one example, as a double data rate (DDR) synchronous dynamic random access memory (SDRAM). The block 104 may be implemented using one or more double data rate (e.g., DDR, DDR2, DDR3, etc.) memory devices. The block 102 may have one or more interfaces 106 that may receive access requests and an interface 108 that may present and receive signals to and from the block 104.

The block 102 may comprise a block (or circuit) 110, a block (or circuit) 112, a number of blocks (or circuits) 114a-114n, a block (or circuit) 116, a block (or circuit) 118, and a block (or circuit) 120. The block 110 may implement a DDR BIST controller (DBC) module in accordance with an embodiment of the present invention. The block 110 may be used to test a memory implemented by the block 104. The block 112 may be implemented, in one example, as an embedded processor (e.g., an ARM microprocessor, etc.). The blocks 114a-114n may implement DDR clients. The DDR clients are generally used during normal functional modes. The DDR clients may request read/write access to the memory implemented in the block 104. In one example, the block 114a could be implemented as a Direct Memory Access (DMA) unit that transfers data to a DDR SDRAM based on access requests presented at the interface 106.

The block 116 may be implemented, in one example, as a multiplexing module. The block 118 may be implemented as a memory controller. In one example, the block 118 may be implemented as a DDR SDRAM memory controller. The block 120 may be implemented, in one example, using a DDR physical layer macro (PHY). The block 120 generally implements an interface that provides the physical timing of the DDR interface signals, such as clock, command, data, and DQS. On writes the block 120 minimizes skew on the transmit signals. On reads, the block 120 may capture the DQ data by delaying DQS by one-quarter of the clock cycle. The block 120 generally includes the capability to perform training of the one-quarter cycle DQS delay.

In one example, the block 110 may support one or more of DDR1, DDR2, and DDR3 memories. The block 110 may be configured to generate several R/W and march patterns. The block 110 may check for errors on reads and log the result in a log register file and other status registers. The block 110 may be connected to the block 112 by an advanced peripheral bus (APB) interface. In one example, the APB interface may be compliant with the APB3 specification. However, other interfaces may be implemented accordingly to meet the design criteria of a particular implementation. The block 112 generally configures the test to be run, indicates when to start, polls for completion, and then checks the result.

The block 110 generally interfaces to the block 120 through the block 116. The block 116 is generally configured to allow either the memory controller 118 or the block 110 to take control of the block 120. The block 120 is generally implemented outside of the module 110. In one example, the block 120 may be implemented using a hardmacro memory PHY, such as a DDR1/2 PHY or a DDR2/3 PHY. The term hardmacro, as used herein, generally refers to a design of a logic function on a chip that specifies how desired logic elements are interconnected and specifies the physical pathways and wiring patterns between the components. A hardmacro may be contrasted to a softmacro, which refers to a design of a logic function on a chip that specifies how the desired logic elements are interconnected, but does not specify the physical wiring pattern. The block 120 and DDR I/O pads generally manage inter-signal skew and timing to the block 104. The block 120 may include, for example, support for DQS and read gate training.

Figure 2:
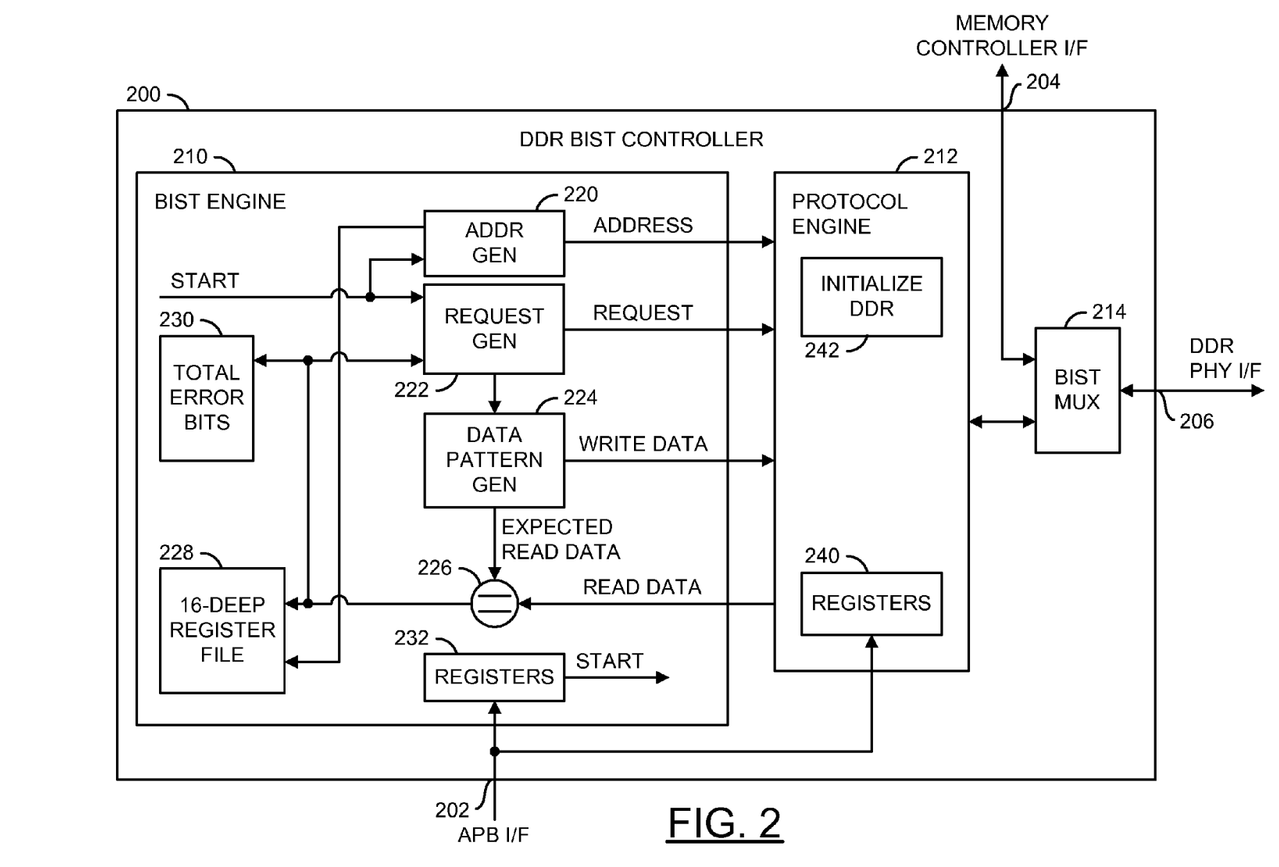
FIG. 2 is a block diagram of a double data rate (DDR) built in self test (BIST) controller in accordance with an embodiment of the present invention.

Referring to FIG. 2, a diagram is shown illustrating a module 200 in accordance with an embodiment of the present invention. The module 200 may be used to implement a DDR BIST controller (DBC). In one example, the blocks 110 and 116 of FIG. 1 may be implemented using the module 200. The module 200 may have a first interface 202, a second interface 204 and a third interface 206. The interface 202 may be configured, in one example, to implement an advanced peripheral bus (APB) interface. In one example, the interface 202 may be configured for compliance with the APB3 interface standard. The interface 204 may be configured to connect with an external memory controller (e.g., the block 118 in FIG. 1). The interface 206 may be configured to connect with a DDR PHY interface (e.g., the block 120 in FIG. 1). However, other bus and/or device interfaces may be implemented accordingly to meet the design criteria of a particular implementation.

The module 200 may include a built-in self test (BIST) engine 210 and a protocol engine 212. In one example, the protocol engine 212 may support DDR1, DDR2, and DDR3 memories. The BIST engine 210 may be configured to generate various memory test patterns. For example, the BIST engine 210 may include several R/W and march pattern generators. The BIST engine 210 generally checks for errors on reads and logs the result in a log register file and other status registers. The BIST engine 210 generally implements an APB interface. The APB interface allows an external processor (e.g., the processor 112 in FIG. 1) to configure the test to be run, indicate when to start, poll for completion, and check the result. The memory test patterns generated by the BIST engine 210 may include, but are not limited to, tests such as checkerboard, write/read address, XOR address, and march patterns. Each test pattern may be implemented generally by sub-modules for generating requests, address, and data.

In an example embodiment, the BIST engine 210 may comprise an address generation module 220, a request generation module 222, a data pattern generation module 224, a comparator module 226, a register file 228, a total error bits register 230, and registers 232. The address generation module 220 may generate addresses that are either sequential or following a march pattern. Address ranges may be specified for the area within the memory device 104 to be tested. The request generation module 222 generally provides control for opening and closing DDR device rows, sequencing between read and write requests, and determining when to start and stop the transfer. Operations of the address generation module 220 and the request generation module 222 may be initiated by an event (e.g., START) provided by the registers 232.

The data pattern generation module 224 may specify a data pattern and how to vary the pattern during the memory test. The data pattern generation module 224 supplies the data to the protocol engine 212 on writes (e.g., via a signal WRITE DATA). The data pattern generation module 224 also provides expected data to the comparator module 226 on reads (e.g., via a signal EXPECTED READ DATA). The comparator module 226 also receives data from the protocol engine 212 on reads (e.g., via a signal READ DATA). When an error is detected between the expected data and the data received from the protocol engine 212, the location and size of the error may be captured in the register file 228, the total error bits value maintained in the total error bits register 230 may be incremented by 1, and, optionally, the transfer in request generation module 222 may be stopped or paused based on configuration information set by the registers 232.

The address generation module 220 and request generation module 222 generally provide the requests and addresses to the protocol engine 212 on both writes and reads. The register file 228 generally captures the error locations and number of bits in error that are found during each test run. In one example, the register file 228 may be implemented as a 16-deep register file configured to capture the first 16 error locations and number of bits in error during each test run. The total error bits register 230 generally indicates the total number of bits found in error during the test. The registers 232 are generally used for configuring which memory test to perform, starting the test (e.g., the signal START being asserted), polling for completion, and reading the results of the test. The registers 232 are generally accessed using the interface 202.

The protocol engine 212 may implement DDR1, DDR2, and/or DDR3 protocols compliant with JEDEC standards. The protocol engine 212 may use programmable parameters to allow support for the full JEDEC range of devices. In one example, the programmable parameters may be set using registers 240. The protocol engine 212 generally allows for an option of firmware 242 to drive a DDR initialization sequence and then turn control over to the GIST engine 210. The protocol engine 212 may provide periodic refreshes when enabled. The protocol engine 212 generally supports a prefetch low-power mode as an automatic hardware initiated mode and a self-refresh low-power mode as a firmware initiated mode. The protocol engine 212 may perform multiple writes and reads within the same DDR row with only one activate and precharge for optimal performance during both the sequential and march pattern tests. The protocol engine 212 generally supports the full range of DDR1, DDR2, and DDR3 JEDEC supported sizes.

The multiplexing module (MUX) 214 is generally included in the module 200 to switch a connection to the DDR interface 206 between the module 200 and the external memory controller 118. A selection made by the MUX 214 may only be changed when a memory attached to the interface 108 is in a self-refresh mode. The MUX 214 is placed within a synchronous path so that no glitches will occur to the DDR interface 206 during the switching. After the MUX 214 switches, the selected memory control device (e.g., the BDC 110 or the memory controller 118) may exit the self-refresh mode and begin memory transfers to the DDR PHY interface 206. The registers 232 may be configured to provide the control signal to the MUX 214 that indicates which block is selected by the MUX 214.

The BIST engine 210 generally provides a flexibility to have complete control of when to open or close a row in a bank. Control is provided, in one example, by a configuration bit (e.g., RWPageAccess) within the registers 232. In a first mode the configuration bit RWPageAccess is set to a logic LOW (e.g., 0). In a second mode the configuration bit RWPageAccess is set to a logic HIGH (e.g., 1). When the configuration bit RWPageAccess is set to a logic LOW (e.g., 0), each READ or WRITE command may have a respective ACTIVE and PRECHARGE command (or request). For example, for each command, first an ACTIVE command will be issued, then the READ/WRITE command and finally a PRECHARGE command will be issued to close that row in that particular bank. The above method of sending READ and WRITE commands is generally slow because of the overhead of generating ACTIVE and PRECHARGE commands. But at the same time the above method saves on the internal logic of the protocol engine 212 used to keep a check of the active rows in a bank. Another purpose of the above mode may be to catch additional defects within the memory being tested (e.g., the memory device 104 in FIG. 1). For example, timing faults may be caught between opening a row within the DDR SDRAM and being able to access a column within the DDR SDRAM. Improved performance may be obtained in the second mode, which provides a flexibility of sending an ACTIVE command only when a new row needs to be addressed and sending a PRECHARGE command only when there is an ACTIVE row and a new row in the same bank needs to be addressed. The second mode is generally enabled by setting the configuration bit RWPageAccess to a logic HIGH, (e.g., 1).

In one example, the ACTIVE and PRECHARGE requests may be given by the GIST engine 210 to the protocol engine 212 as a 2-bit interface signal (e.g., App_RowCtrl[1:0]). The request information is generally provided as part of each REQUEST from the request generation module 222 to the protocol engine 212. Example values for the signal App_RowCtrl[1:0] may be summarized in the following TABLE 1:

TABLE 1

| App_RowCtrl[1] | App_RowCtrl[0] | Command(s) |
| --- | --- | --- |
| 0 | 0 | ACTIVE and PRECHARGE |
| 0 | 1 | ACTIVE |
| 1 | 0 | PRECHARGE |
| 1 | 1 | No ACTIVE, no PRECHARGE |

When the configuration bit RWPageAccess=0, the signal App_RowCtrl[1:0] is generally generated with the value 2'b00, indicating that each READ or WRITE command has a respective ACTIVE and PRECHARGE command (or request). When the configuration bit RWPageAccess=1, the signal App_RowCtrl[1:0] may also be generated with the value 2'b00 when the start address of the test is the last column of a row. In this case, the ACTIVE command is issued since it is the start of the test and the PRECHARGE command is issued since it is the last column of a row.

The BIST engine 210 generally issues only an ACTIVE command (e.g., App_RowCtrl[1:0]=01) on a start of a test or when the first qword (e.g., a quadword or 64-bit value) of a row is addressed. The BIST engine 210 generally issues a PRECHARGE command (e.g., App_RowCtrl[1:0]=10) when the last qword of an ACTIVE row is addressed or at the end of the test. In one example, the precharge operation may be based on an AutoPrecharge Enable configuration bit. If the AutoPrecharge Enable configuration bit is set by the user, autoprecharge will be used at the end of a READ/WRITE command issued with App_RowCtrl[0]=0 (e.g., requesting a precharge). If the AutoPrecharge Enable configuration bit is disabled, a PRECHARGE command is issued at the end of a READ/WRITE command issued with App_RowCtrl[0]=0. The signal App_RowCtrl=00 may be used when both an ACTIVE and PRECHARGE are needed, such as when the configuration bit RWPageAccess is low (0). The signal App_RowCtrl=11 may be used when neither an ACTIVE nor a PRECHARGE are needed, such as in the middle of a transfer within the same row when RWPageAccess is high (1).

Figure 3:
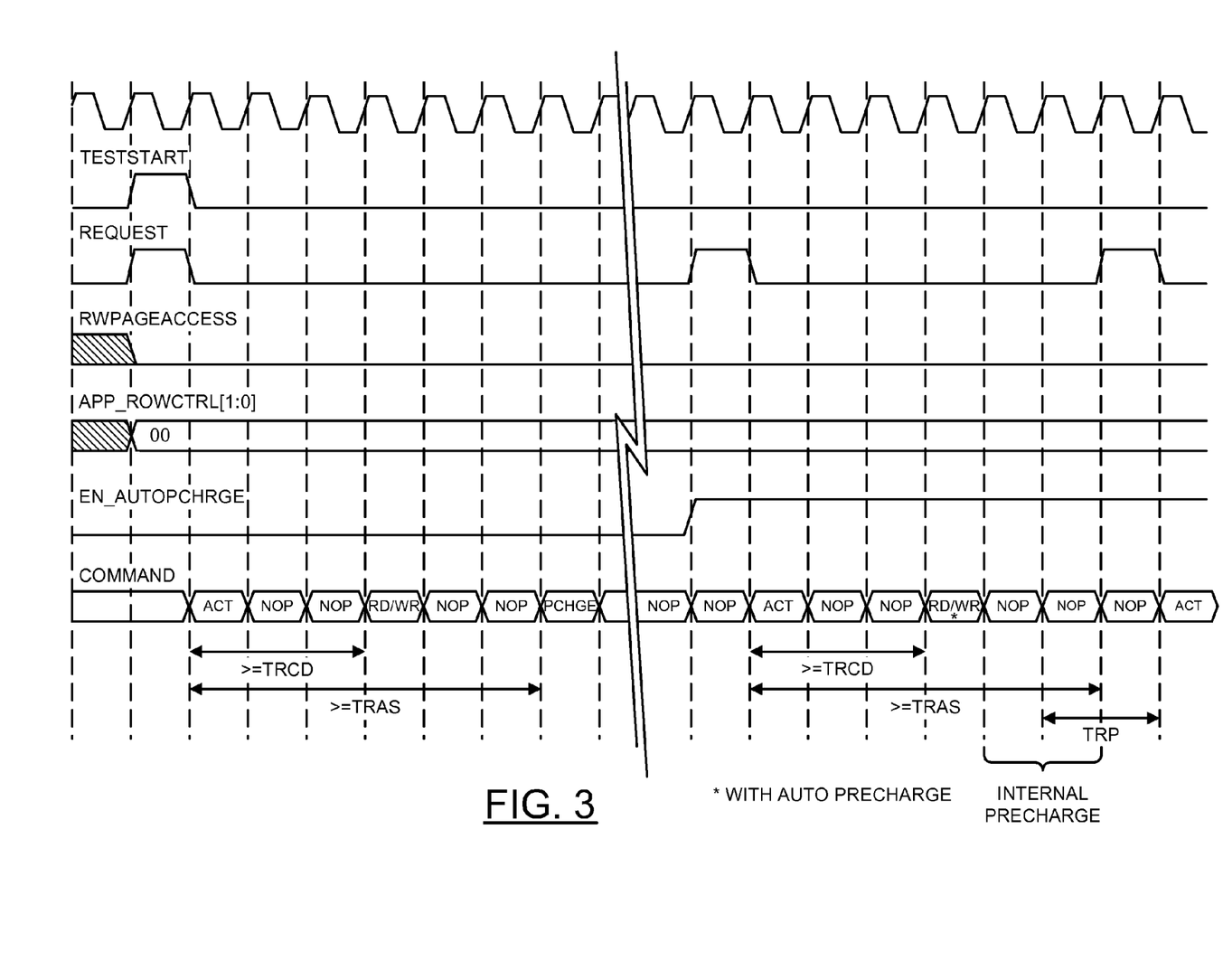
FIG. 3 is a timing diagram illustrating an example command sequence in accordance with a first mode of operation of the a module 200 of FIG. 2.

Referring to FIG. 3, a timing diagram is shown illustrating an example command sequence in accordance with a first mode of operation of the module 200 of FIG. 2. Command sequences are shown with and without auto precharge enabled when the configuration bit RWPageAccess is set to a logic 0. Upon the start of a test, when the configuration bit RWPageAccess is configured to logic 0, the 2-bit signal App_RowCtrl[1:0] always has a value of 2b'00. Because the 2-bit signal App_RowCtrl[1:0] always has the value b'00, for each READ/WRITE command there will be an ACTIVE command and a PRECHARGE command (auto precharge if the auto precharge enable is set). In general, the REQUEST pulses mean to do one RD/WR command worth of data transfer plus optionally to do an ACTIVE and PRECHARGE depending on the states of App_RowCtrl[1:0] when REQUEST is high.

Figure 4:
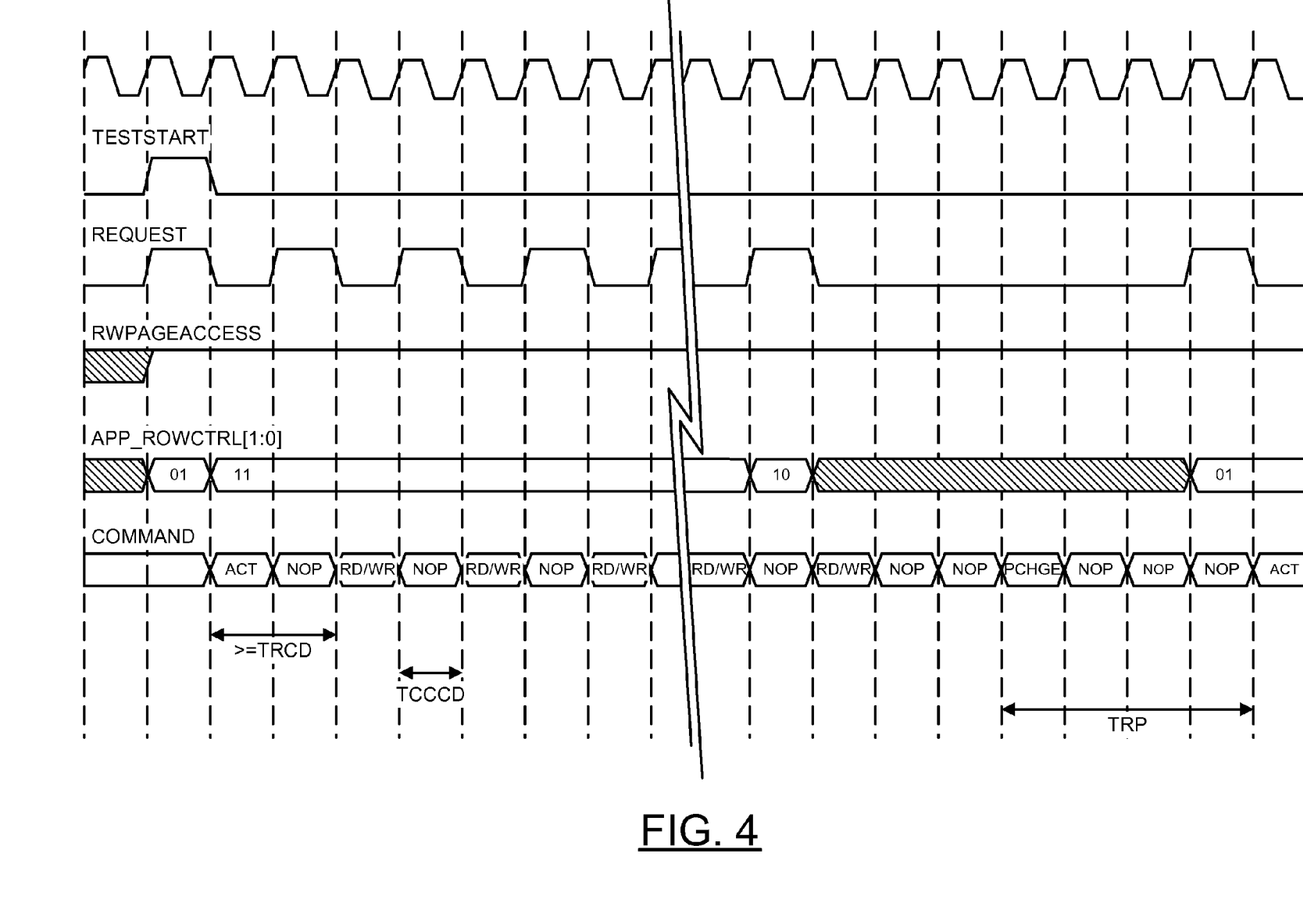
FIG. 4 is a timing diagram illustrating an example command sequence during a second mode of operation of the module 200 of FIG. 2.

Referring to FIG. 4, a timing diagram is shown illustrating an example command sequence during a second mode of operation of the module 200 of FIG. 2. Upon the start of a test, the first read/write command generally needs an ACTIVE command since the start address of the SDRAM row needs to be opened for access. For example, the signal App_RowCtrl [1:0] may be set to a value of 2b'01 and the signal REQUEST asserted (e.g., set HIGH) to present the ACTIVE command to the block 212. Following the ACTIVE command, no further rows need to be opened until the end of the row is reached. Hence, the state of the interface signal App_RowCtrl[1:0] generally has a value of 2b'11 each time the signal REQUEST is asserted during a period in which only READ/WRITE commands are issued to the SDRAM. Once the end address of the test is reached or the end of an ACTIVE row is reached, the activated row needs to be closed by issuing a PRECHARGE command. The PRECHARGE command is issued when the interface signal App_RowCtrl[1:0] is set to a value of 2b'10 and the signal REQUEST asserted (e.g., set HIGH) to present the PRECHARGE command to the block 212. Thus, by implementing the configuration bit RWPageAccess, the opening and closing of SDRAM rows may be controlled in complete automation by the protocol engine 212.

Figure 5:
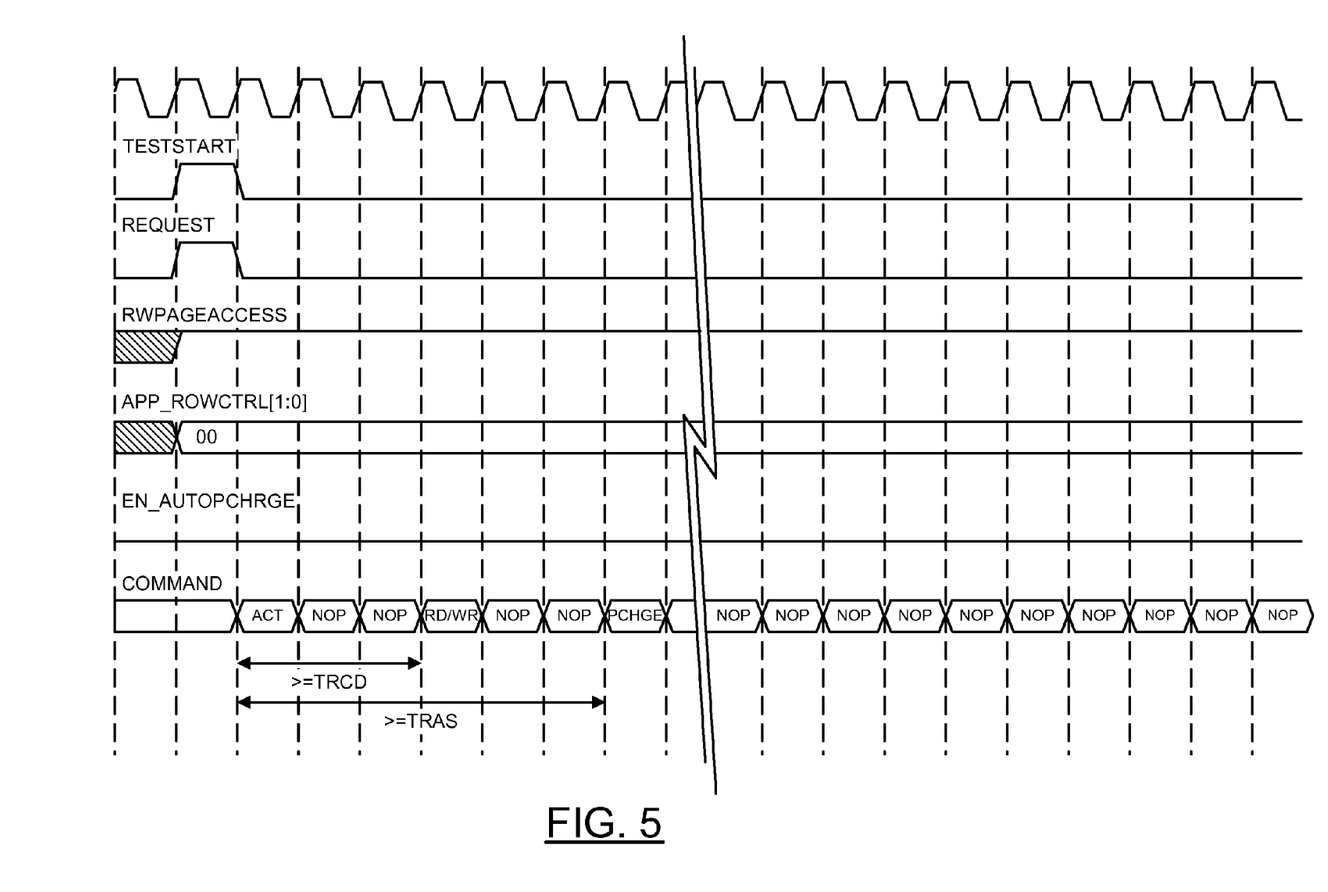
FIG. 5 is a timing diagram illustrating another command sequence during the second mode of operation of the module 200 of FIG. 2.

Referring to FIG. 5, a timing diagram is shown illustrating the interface signal App_RowCtrl[1:0]=00 during the second mode of operation of the module 200 of FIG. 2. When the configuration bit RWPageAccess=1, the signal App_RowCtrl [1:0] may also be generated with the value 2'b00 when the start address of the test is the last column of a row. In this case, the ACTIVE command is issued since it is the start of the test and the PRECHARGE command is issued since it is the last column of the row.

Figure 6:
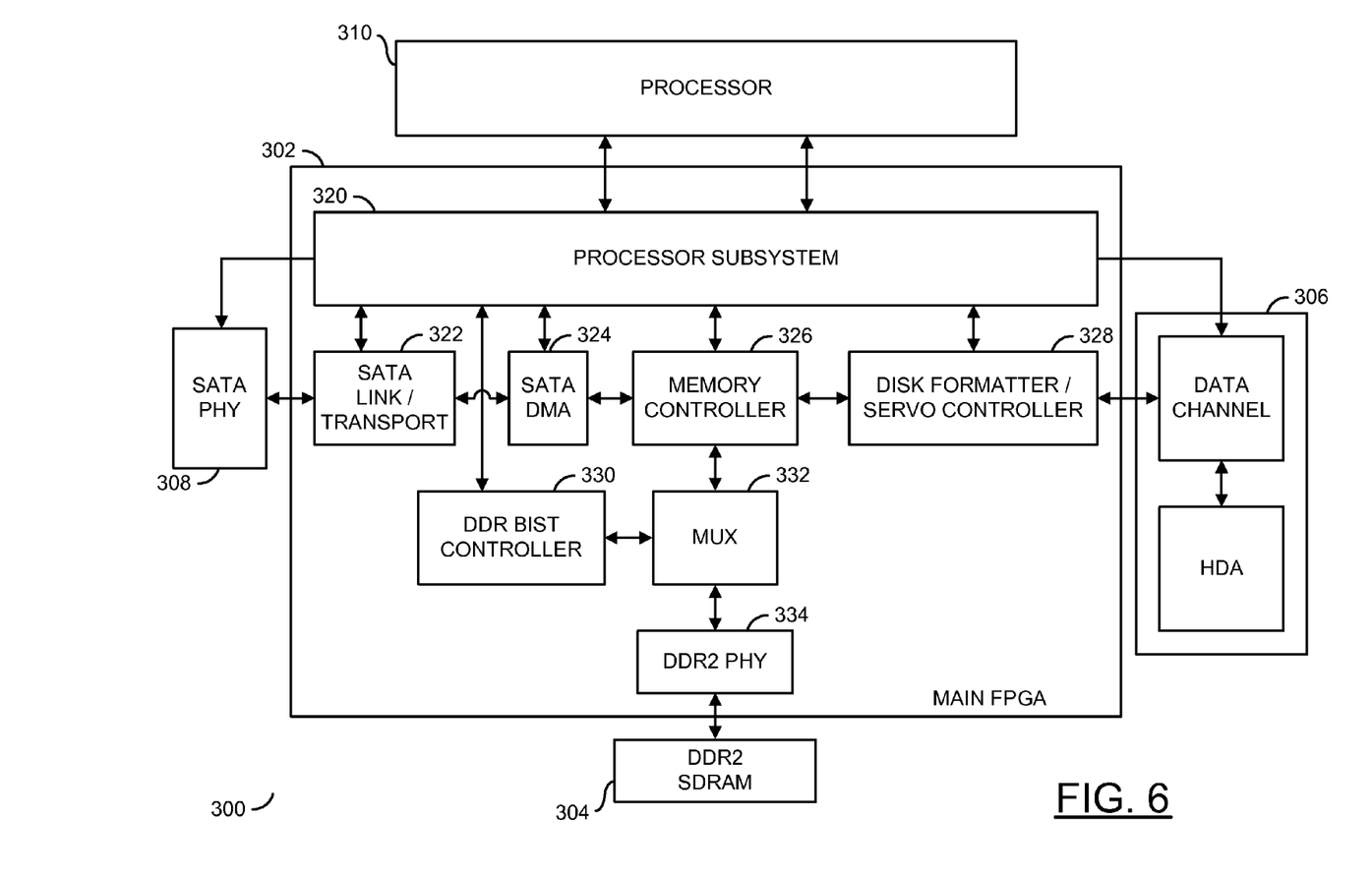
FIG. 6 is a diagram illustrating an example application of a DDR BIST controller in accordance with an embodiment of the present invention.

Referring to FIG. 6, a diagram of a system 300 is shown illustrating an example application of a DDR BIST controller in accordance with an embodiment of the present invention. In one example, the system 300 may comprise a module 302, a module 304, a module 306, a module 308 and a module 310. The module 302 may implement a hard drive controller (HDC) including a DDR BIST controller in accordance with an embodiment of the present invention. The module 304 may implement a DDR2 SDRAM module. The module 306 may implement a data channel 310 and head and disk assembly (HDA) 312 of a mass storage device controlled by the module 302. The module 308 may implement a physical layer for a serial advanced technology attachment bus interface (SATA PHY). The module 310 may implement a processor. In one example, the module 310 may implement a multimedia processor. In one example, the HDC 302 may be implemented in a field programmable gate array (FPGA). The module 302 may be mounted on a printed circuit board (e.g., a motherboard). The modules 304, 306, 308, and 310 may be implemented as separate chips and/or PCBs (e.g., daughtercards).

In one example, the module 302 may comprise a block 320, a block 322, a block 324, a block 326, a block 328, a block 330, a block 332, and a block 334. The blocks 320-334 may represent modules and/or circuits that may be implemented as hardware, software, a combination of hardware and software, or other implementations. The block 320 may implement a processor subsystem. The block 322 may implement a serial advanced technology attachment (SATA) link/transport layer. The block 324 may implement a SATA direct memory access (DMA) module. The block 326 may implement a memory controller. The block 328 may implement a disk formatter and/or servo controller. The block 330 may implement a DDR BIST controller in accordance with an embodiment of the present invention. The block 332 may implement a BIST multiplexer. The block 334 may implement a DDR PHY. In one example, the blocks 330 and 332 may be implemented using the module 200 (described above in connection with FIG. 2).

The functions illustrated by the diagrams of FIGS. 1-6 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

As would be apparent to those skilled in the relevant art(s), the signals illustrated in FIGS. 1, 2 and 6 represent logical data flows. The logical data flows are generally representative of physical data transferred between the respective blocks by, for example, address, data, and control signals and/or busses. The systems 100 and 300 illustrated in FIGS. 1 and 6 may be implemented in hardware, software or a combination of hardware and software according to the teachings of the present disclosure, as would be apparent to those skilled in the relevant art(s).

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a protocol engine; and
   a built-in self test (BIST) engine coupled to said protocol engine, wherein said protocol engine is configured to couple said BIST engine to a synchronous dynamic random access memory (SDRAM) and said BIST engine is configured to directly control when to open and close rows of said synchronous dynamic random access memory (SDRAM) during double data rate (DDR) operations.

2. The apparatus according to claim 1, wherein (i) said BIST engine comprises a first output configured to present address information, a second output configured to present a request, a third output configured to present data to be written to said SDRAM, and an input configured to receive data retrieved from said SDRAM, and (ii) said address information, said request, said data to be written to said SDRAM, and said data retrieved from said SDRAM are presented to or received from said protocol engine.

3. The apparatus according to claim 1, wherein said BIST engine controls opening and closing of said rows using information added to each request from said BIST engine to said protocol engine.

4. The apparatus according to claim 3, wherein said information added to each request comprises two bits configured to specify when to open and close rows.

5. The apparatus according to claim 3, wherein each request includes whether the request is a read or a write command.

6. The apparatus according to claim 1, wherein said BIST engine comprises:
   an address generator configured to generate address information;
   a request generator configured to generate a request in response to a first control signal and a second control signal;
   a data pattern generator configured to generate data to be written to said SDRAM; and
   a comparator configured to generate said second control signal based upon a comparison of the data written to said SDRAM and data retrieved from said SDRAM.

7. The apparatus according to claim 6, wherein said data pattern generator is configured to generate said data to be written to said SDRAM using a data pattern selected from the group consisting of static, increment, checkerboard, odd mode switching, XOR address, and inverted.

8. The apparatus according to claim 6, wherein said BIST engine comprises:
   a circuit configured to determine a total number of error bits in response to a comparison of data written to said SDRAM and data retrieved from said SDRAM.

9. The apparatus according to claim 1, wherein:
   in a first mode, a precharge occurs on every read and write command; and
   in a second mode, a precharge occurs only at the end of a row or test.

10. The apparatus according to claim 9, wherein said precharge is performed with either a precharge command or an auto-precharge command.

11. The apparatus according to claim 1, wherein said BIST engine is configured to control whether ACTIVE and PRECHARGE occur at a granularity of whichever is larger between a 64-bit access and a DDR burst length.

12. The apparatus according to claim 1, wherein said BIST engine and said protocol engine are implemented in a field programmable gate array.

13. The apparatus according to claim 1, wherein said BIST engine and said protocol engine are implemented in an integrated circuit.

14. The apparatus according to claim 1, wherein said protocol engine and said BIST engine are part of a DDR BIST controller.

15. The apparatus according to claim 1, further comprising a multiplexing circuit configured to couple said protocol engine to said SDRAM.

16. The apparatus according to claim 15, further comprising a circuit coupling said multiplexing circuit to said SDRAM, said circuit implementing a DDR physical layer (PHY).

17. The apparatus according to claim 16, wherein said circuit implements at least one of a DDR1/2 PHY and a DDR2/3 PHY.

18. An apparatus comprising:
   means for implementing a memory protocol; and
   means for performing built-in self test (BIST) configured to provide a sideband interface to said memory protocol implementing means, wherein said BIST performing means has complete control of when to open and close rows of a synchronous dynamic random access memory (SDRAM) during double data rate (DDR) operations and said memory protocol implementing means is configured to couple said BIST performing means to said synchronous dynamic random access memory.

19. A computer readable storage medium comprising an IP block for implementing the apparatus according to claim 1 using one or more electronic design automation tools.

20. The apparatus according to claim 1, wherein said BIST engine comprises one or more registers coupling said BIST engine to an advance peripheral bus interface.

21. The apparatus according to claim 1, wherein said BIST engine comprises a register file configured to store one or more addresses at which an error has occurred and corresponding error bytes.

* * * * *